US008604470B2

(12) United States Patent
Yim et al.

(10) Patent No.: US 8,604,470 B2
(45) Date of Patent: Dec. 10, 2013

(54) OXIDE THIN FILM TRANSISTOR AND METHOD OF FABRICATING THE SAME

(75) Inventors: Hoon Yim, Paju (KR); Dae-Hwan Kim, Paju (KR)

(73) Assignee: LG Display Co., Ltd, Seoul (KR)

( * ) Notice: Subject to any disclaimer, the term of this patent is extended or adjusted under 35 U.S.C. 154(b) by 207 days.

(21) Appl. No.: 13/106,482

(22) Filed: May 12, 2011

(65) Prior Publication Data

US 2011/0278565 A1    Nov. 17, 2011

(30) Foreign Application Priority Data

May 12, 2010  (KR) .......................... 10-2010-0044659

(51) Int. Cl.
*H01L 29/786*    (2006.01)
(52) U.S. Cl.
USPC ............... 257/43; 257/E21.411; 257/E29.273
(58) Field of Classification Search
USPC ......... 257/223, 227, 291, 292, 439, 443, 655, 257/E27.1, E27.125, E27.112, E29.117, 257/E29.145, E29.147, E29.151, E29.182, 257/E29.202, E29.273–299, E29.314, 257/E29.32, E23.016
See application file for complete search history.

(56) References Cited

U.S. PATENT DOCUMENTS

2010/0051935 A1*  3/2010  Lee et al. ..................... 257/43

OTHER PUBLICATIONS

Office Action issued in corresponding Chinese Patent Application No. 201110126276.0, mailed May 24, 2013, 13 pages.

* cited by examiner

*Primary Examiner* — Mamadou Diallo
(74) *Attorney, Agent, or Firm* — Brinks Gilson & Lione

(57) ABSTRACT

An oxide thin film transistor (TFT) and a fabrication method thereof are provided. The method for fabricating an oxide thin film transistor (TFT) comprises: forming a gate electrode on a substrate; forming a gate insulating layer on the substrate with the gate electrode formed thereon; forming an active layer made of oxide semiconductor on the gate insulating layer; forming a contact layer on the substrate with the active layer formed thereon and forming source and drain electrodes, which are electrically connected with source and drain regions of the active layer through the contact layer, on the contact layer; forming a protective layer on the substrate with the source and drain electrodes formed thereon; forming a contact hole by removing the protective layer to expose the drain electrode; and forming a pixel electrode electrically connected with the drain electrode through the contact hole, wherein the contact layer is made of oxide including a different metal or conductivity with that of the source and drain electrodes, to adjust a threshold voltage according to the difference in a work function.

8 Claims, 6 Drawing Sheets

OXIDE THIN FILM TRANSISTOR AND METHOD OF FABRICATING THE SAME

Pursuant to 35 U.S.C. §119(a), this application claims the benefit of earlier filing date and right of priority to Korean Application 10-2010-0044659, filed on May 12, 2010, the content of which is incorporated by reference herein in its entirety.

BACKGROUND

1. Field of the Invention

The present disclosure relates to an oxide thin film transistor (TFT) and its fabrication method, and more particularly, to an oxide TFT having an amorphous zinc oxide semiconductor as an active layer, and its fabrication method.

2. Discussion of the Related Art

As consumer interest in information displays is growing and the demand for portable (mobile) information devices is increasing, research and commercialization of light and thin flat panel displays ("FPD"), which substitute cathode ray tubes (CRTs), the conventional display devices, has increased. Among FPDs, the liquid crystal display ("LCD") is a device for displaying images by using optical anisotropy of liquid crystal. LCD devices exhibit excellent resolution, color display and picture quality, so they are commonly used for notebook computers or desktop monitors, and the like.

The LCD includes a color filter substrate, an array substrate and a liquid crystal layer formed between the color filter substrate and the array substrate.

An active matrix (AM) driving method commonly used for the LCD is a method in which liquid crystal molecules in a pixel part are driven by using amorphous silicon thin film transistors (a-Si TFTs) as switching elements.

The structure of a related art LCD will now be described in detail with reference to FIG. 1.

FIG. 1 is an exploded perspective view showing a related art LCD device.

As shown in FIG. 1, the LCD includes a color filter substrate 5, an array substrate 10 and a liquid crystal layer 30 formed between the color filter substrate 5 and the array substrate 10.

The color filter substrate 5 includes a color filter (C) including a plurality of sub-color filters 7 that implement red, green and blue colors, a black matrix 6 for dividing the sub-color filters 7 and blocking light transmission through the liquid crystal layer 30, and a transparent common electrode 8 for applying voltage to the liquid crystal layer 30.

The array substrate 10 includes gate lines 16 and data lines 17 which are arranged vertically and horizontally to define a plurality of pixel areas (P), TFTs (T), switching elements, formed at respective crossings of the gate lines 16 and the data lines 17, and pixel electrodes 18 formed on the pixel areas (P).

The color filter substrate 5 and the array substrate 10 are attached in a facing manner by a sealant (not shown) formed at an edge of an image display region to form a liquid crystal panel, and the attachment of the color filter substrates 5 and the array substrate 10 is made by an attachment key formed on the color filter substrate 5 or the array substrate 10.

The foregoing LCD is light and has low power consumption, as such, the LCD receives much attention, but the LCD is a light receiving device, not a light emission device, having a technical limitation in brightness, a contrast ratio, a viewing angle, and the like. Thus, a new display device that can overcome such shortcomings is being actively developed.

An organic light emitting diode (OLED), one of new flat panel display devices, is self-emissive, having a good viewing angle and contrast ratio compared with the LCD, and because it does not require a backlight, it can be formed to be lighter and thinner. Also, the OLED is advantageous in terms of power consumption. Besides, the OLED can be driven with a low DC voltage and has a fast response speed, and in particular, the OLED is advantageous in terms of a fabrication cost.

Recently, research for an increase of a size of an OLED display device is actively ongoing, and in order to achieve such a large-scale OLED display device, development of a transistor that can secure constant current characteristics as a driving transistor of an OLED to ensure a stable operation and durability is required.

An amorphous silicon thin film transistor (TFT) used for the above-described LCD may be fabricated in a low temperature process, but has a very small mobility and fails to satisfy a constant current bias condition. Meanwhile, a polycrystalline silicon TFT has a high mobility and satisfying constant current bias condition but fails to secure uniform characteristics, making it difficult to have a large area and requiring a high temperature process.

Thus, an oxide TFT including an active layer formed with oxide semiconductor is being developed, but in this case, in an oxide TFT having a general bottom gate structure using oxide semiconductor, the oxide semiconductor has n-type characteristics, so the oxide TFT is fabricated to have a structure without an n+ layer, unlike the existing amorphous silicon TFT.

FIG. 2 is a sectional view sequentially showing the structure of a related art oxide TFT.

As shown in FIG. 2, the related art oxide TFT includes a gate electrode 21 formed on a substrate 10, a gate insulating layer 15a formed on the gate electrode 21, an active layer 24 made of oxide semiconductor and formed on the gate insulating layer 15a, source and drain electrodes 22 and 23 electrically connected with certain areas of the active layer 24, a protective layer 15b formed on the source and drain electrodes 22 and 23, and a pixel electrode 18 electrically connected with the drain electrode 23.

Unlike the existing amorphous silicon TFT, the related art oxide TFT is advantageous in that it is fabricated to have a structure without an n+ layer, so the process can be simplified.

Since the oxide TFT using oxide semiconductor as an active layer has excellent mobility characteristics, research into the oxide TFT is actively ongoing, and attempts of fabricating a back plane of a next-generation flat display by using the oxide TFT have continued, but research into the characteristics of the source and drain electrodes used in the oxide TFT have not been sufficiently conducted. In particular, as for the research into the source and drain electrodes, materials, contact characteristics, parasitic resistance, and the like, have not been sufficiently studied.

As mentioned above, the oxide TFT has an advantage in terms of the processing, namely, in that an n+ layer is not required to be formed, but such as advantage works as a disadvantage in terms of element characteristics. For example, in spite of the presence of a material having various work functions, since the source and drain electrodes are limited to use a material having low resistance, conductive material such as copper (Cu), molybdenum (Mo), a molybdenum alloy, or the like, is limitedly used as the material of the source and drain electrodes, and in case of the oxide TFT, a threshold voltage Vth is shifted to a negative voltage area due to the contact characteristics between the oxide semiconductor and the source and drain electrodes. As a result, it is difficult to form a driver integrated circuit (IC) on the substrate.

BRIEF SUMMARY

An oxide thin film transistor (TFT) includes: a gate electrode formed on a substrate; a gate insulating layer formed on the substrate with the gate electrode formed thereon; an active layer made of oxide semiconductor and formed on the gate insulating layer; a contact layer formed on the substrate with the active layer formed thereon; source and drain electrodes formed on the substrate with the contact layer formed thereon and electrically connected with source and drain regions of the active layer; a protective layer formed on the substrate with the source and drain electrodes formed thereon; a contact hole formed by removing the protective layer to expose the drain electrode; and a pixel electrode electrically connected with the drain electrode through the contact hole, wherein the contact layer is made of oxide including a different metal or conductivity with that of the source and drain electrodes, to adjust a threshold voltage according to the difference in a work function.

Also disclosed is a method for fabricating an oxide thin film transistor (TFT), that includes: forming a gate electrode on a substrate; forming a gate insulating layer on the substrate with the gate electrode formed thereon; forming an active layer made of oxide semiconductor on the gate insulating layer; forming a contact layer on the substrate with the active layer formed thereon and forming source and drain electrodes, which are electrically connected with source and drain regions of the active layer through the contact layer, on the contact layer; forming a protective layer on the substrate with the source and drain electrodes formed thereon; forming a contact hole by removing the protective layer to expose the drain electrode; and forming a pixel electrode electrically connected with the drain electrode through the contact hole, wherein the contact layer is made of oxide including a different metal or conductivity with that of the source and drain electrodes, to adjust a threshold voltage according to the difference in a work function.

It is to be understood that both the foregoing general description and the following detailed description are exemplary and explanatory and are intended to provide further explanation of embodiments as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE DRAWINGS AND THE PRESENTLY PREFERRED EMBODIMENTS

An oxide thin film transistor (TFT) and its fabrication method according to exemplary embodiments of the present invention will now be described with reference to the accompanying drawings.

Figure 1:
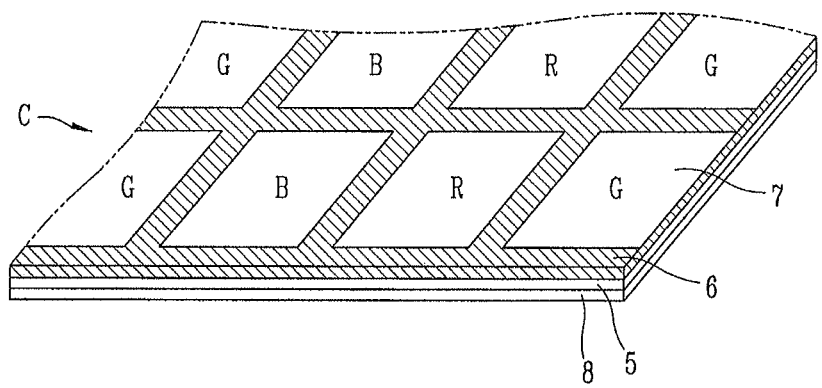
FIG. 1 is an exploded perspective view schematically showing a related art liquid crystal display (LCD) device.
Figure 1:
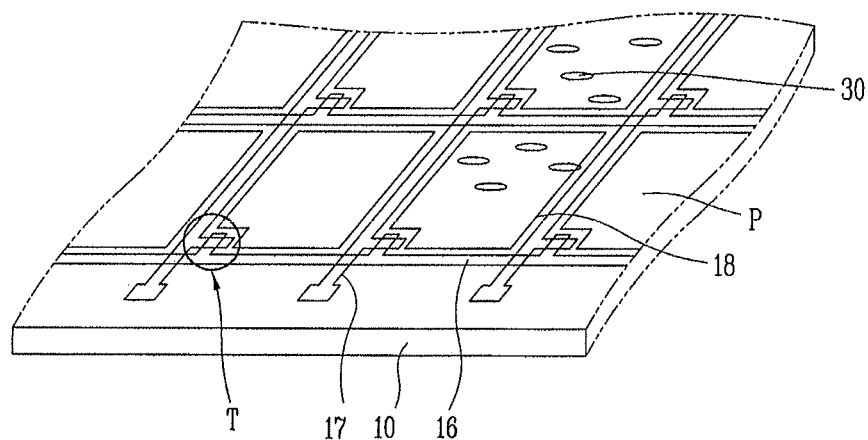
Figure 2:
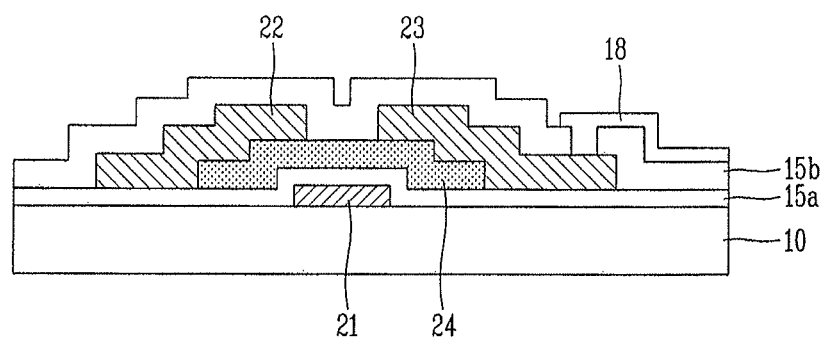
FIG. 2 is a sectional view schematically showing the structure of a related art oxide thin film transistor (TFT)
Figure 3:
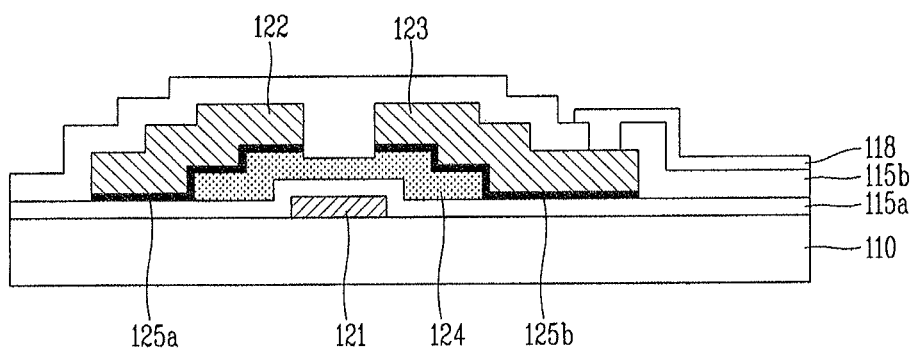
FIG. 3 is a sectional view schematically showing the structure of an oxide TFT according to a first exemplary embodiment of the present invention.

FIG. 3 is a sectional view schematically showing the structure of an oxide TFT according to a first exemplary embodiment of the present invention, in which a back channel etch type oxide TFT is shown.

As shown in FIG. 3, the oxide TFT according to the first exemplary embodiment of the present invention includes a gate electrode 121 formed on a certain substrate 110, a gate insulating layer 115a formed on the gate electrode 121, an active layer 124 made of oxide semiconductor and formed on the gate insulating layer 115a, contact layers 125a and 125b formed on source and drain regions of the active layer 124, and source and drain electrodes 122 and 123 electrically connected with the source and drain regions of the active layer 124 through the contact layers 125a and 125b.

The oxide TFT according to the first exemplary embodiment of the present invention includes a protective layer 115b formed on the substrate 110 with the source and drain electrodes 122 and 123 formed thereon and a pixel electrode 118 electrically connected with the drain electrode 123 through a contact hole formed in the protective layer 115b.

Although not shown, the gate electrode 121 is connected to a certain gate line, and a portion of the source electrode 122 extends in one direction so as to be connected to a data line. The gate line and the data line are arranged vertically and horizontally on the substrate 110 to define a pixel area.

Here, in the oxide TFT according to the first exemplary embodiment of the present invention, for example, the active layer is formed by using amorphous zinc oxide (ZnO) semiconductor to satisfy high mobility and constant current test conditions and secure uniform characteristics, having advantages of being applicable to a large-scale display.

The zinc oxide is a material which can implement three qualities of conductivity, semiconductor characteristics, and resistivity according to the oxygen content, so the oxide TFT employing the amorphous zinc oxide semiconductor material as the active layer can be applicable to a large-scale display including an LCD device and an organic electroluminescence display.

Also, recently, a huge interest and activity are concentrated to a transparent electronic circuit, and in this case, since the oxide TFT employing the amorphous zinc oxide semiconductor material as an active layer has high mobility and can be fabricated at a low temperature, it can be used for the transparent electronic circuit.

In particular, in the oxide TFT according to the first exemplary embodiment of the present invention, the active layer is formed by using a-IGZO semiconductor such as a-InGaZnO$_4$ obtained by containing heavy metals such as indium (In), gallium (Ga), or the like, in ZnO.

The a-IGZO semiconductor, allowing visible ray to pass therethrough, is transparent, and the oxide TFT fabricated by using the a-IGZO semiconductor has mobility of 1 to 100 cm$^2$·Vs, exhibiting high mobility characteristics compared with the amorphous silicon TFT.

Also, since the a-IGZO semiconductor has a wide band gap, it can be used for fabricating a UV light emitting diode (LED) having high color purity, a white LED, and other components, and also, since the a-IGZO semiconductor is processed at a low temperature, it can be used to produce a light, flexible product.

In addition, since the oxide TFT fabricated by using a-IGZO semiconductor exhibits uniform characteristics similar to those of the amorphous silicon TFT, it advantageously has a simple component structure like the amorphous silicon thin film transistor and can be applicable to a large-scale display.

In the oxide TFT having such characteristics according to the first exemplary embodiment of the present invention, the contact layer is formed by depositing a heterogeneous metal or oxide having conductive characteristics between the active layer and the source and drain electrodes, thus improving the contact characteristics between the active layer and the source and drain electrodes. Accordingly, excellent element characteristics can be secured and a threshold voltage and a turn-on voltage can be adjusted according to a work function between the source and drain electrodes and the contact layer. This will now be described through a method for fabricating an oxide TFT as follows.

FIGS. 4A to 4E are sectional views sequentially showing a fabrication process of the oxide TFT illustrated in FIG. 3.

Figure 4A:
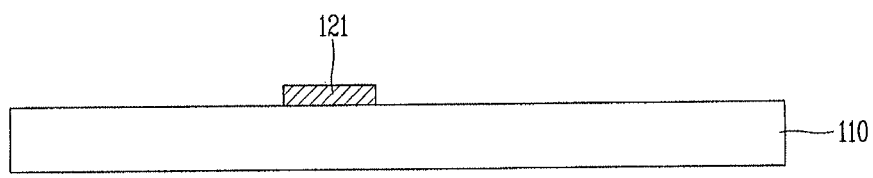
FIGS. 4A to 4E are sectional views sequentially showing a fabrication process of the oxide TFT illustrated in FIG. 3.

As shown in FIG. 4A, the gate electrode 121 is formed on the substrate 110 made of a transparent insulating material.

In this case, oxide semiconductor applied to the oxide TFT can be deposited at a low temperature, so the substrate 110, such as a plastic substrate, soda-line glass, or the like, which can be applicable to a low temperature process can be used. Also, since the oxide semiconductor exhibits amorphous characteristics, it can be used for the substrate 110 employed in a large-scale display device.

The gate electrode 121 is formed by depositing a first conductive film on the entire surface of the substrate 110 and selectively pattering the first conductive film through a photolithography process (a first masking process).

Here, the first conductive film may be made of a low-resistivity obscure conductive material such as aluminum (Al), an Al alloy, tungsten (W), copper (Cu), nickel (Ni), chromium (Cr), molybdenum (Mo), titanium (Ti), platinum (Pt), tantalum (Ta), and the like. Also, the first conductive film may be made of a transparent conductive material such as indium-tin-oxide (ITO), indium-zinc-oxide (IZO), or the like. Also, the first conductive film may have a multilayered structure by stacking two or more conductive materials.

Figure 4B:
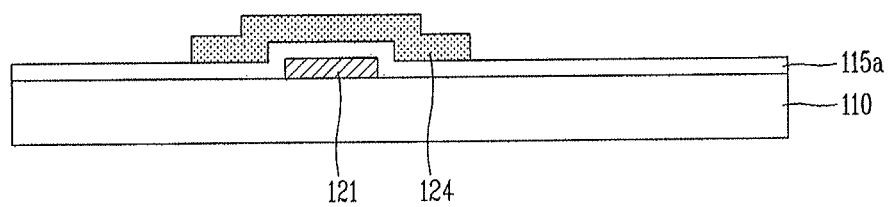

Next, as shown in FIG. 4B, the gate insulating layer 115a formed of an inorganic insulating layer such as a silicon nitride film (SiNx), a silicon oxide film (SiO$_2$), or the like, or a high dielectric oxide film such as hafnium (Hf) oxide, aluminum oxide, is formed on the entire surface of the substrate 110 with the gate electrode 121 formed thereon.

An oxide semiconductor layer made of certain oxide semiconductor is formed on the entire surface of the substrate 110 with the gate insulating layer 115a formed thereon and then patterned through a photolithography process (a second masking process) to form the active layer 124 made of oxide semiconductor at an upper side of the gate electrode 121.

In this case, in the oxide TFT according to the first exemplary embodiment of the present invention, since the active layer 124 is formed by using amorphous zinc oxide semiconductor, high mobility and constant current test conditions are met and uniform characteristics are secured, and thus, the oxide TFT can be applicable to a large-scale display.

Also, as mentioned above, the oxide TFT according to the first exemplary embodiment of the present invention, the active layer 124 is formed with a-IGZO semiconductor obtained by containing heavy metals such as indium, gallium, or the like, in ZnO.

Figure 4C:
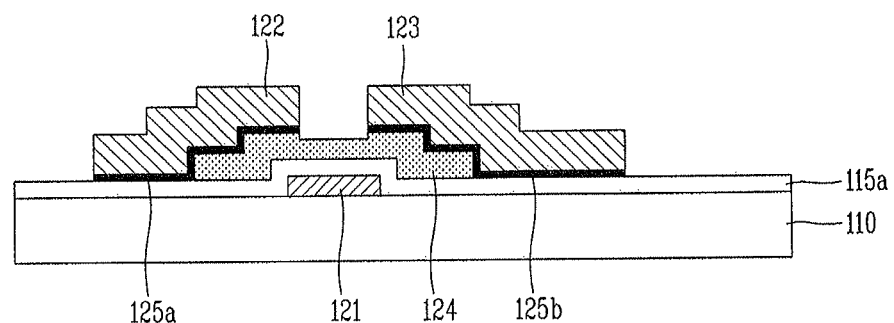

And then, as shown in FIG. 4C, a certain interlayer and a second conductive film are formed on the entire surface of the substrate 110 with the active layer 124 formed thereon by using sputter equipment.

In this case, the second conductive film may be made of copper, molybdenum, a molybdenum alloy such as molybdenum tungsten, or the like, in order to form the source and drain electrodes, and the interlayer may be made of a heterogeneous metal, oxide having conductivity, or the like, in order to adjust the contact characteristics between the active layer 124 and the source and drain electrodes.

For example, the interlayer may be made of a heterogeneous metal such as aluminum, gold, molybdenum, copper, titanium, nickel, or the like, or a heterogeneous alloy such as aluminum neodymium (AlNd), molybdenum titanium (MoTi), molybdenum tungsten (MoW), or the like. Also, the interlayer may be made of conductive oxide such as indium-gallium-zinc-oxide (IGZO), zinc-tin-oxide (ZTO), indium-tin-oxide (ITO), zinc-indium-oxide (ZIO), or the like.

The interlayer may include a conductive polymer or a doped organic material.

In this case, the second conductive film may be formed to have a thickness ranging from 1000 Å to 3000 Å, and the interlayer may be formed to have a thickness ranging from 50 Å to 1000 Å.

Thereafter, the interlayer and the second conductive film are selectively patterned through a photolithography process (a third masking process) to form the contact layers 125a and 125b on the source and drain regions of the active layer 124 and the source and drain electrodes 122 and 123 electrically connected with the source and drain regions of the active layer 124 via the contact layers 125a and 125b.

In this case, the contact layers 125a and 125b and the source and drain electrodes 122 and 123 may be formed through the same masking process or different masking processes.

Also, the active layer 124, the contact layers 125a and 125b, and the source and drain electrodes 122 and 123 may be formed through a single masking process by using a half-tone mask or a slit mask (diffraction mask) (mentioning of the half-tone mask will also include the slit mask, hereinafter).

Figure 4D:
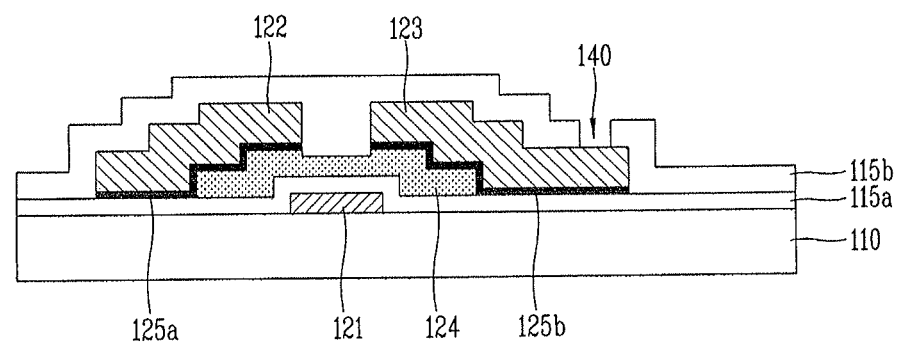

Thereafter, as shown in FIG. 4D, the protective layer 115b is formed on the entire surface of the substrate 110 with the source and drain electrodes 122 and 123 formed thereon and then selectively removed through a photolithography process (a fourth masking process) to form a contact hole 140, exposing a portion of the drain electrode 123, on the substrate 110.

Figure 4E:
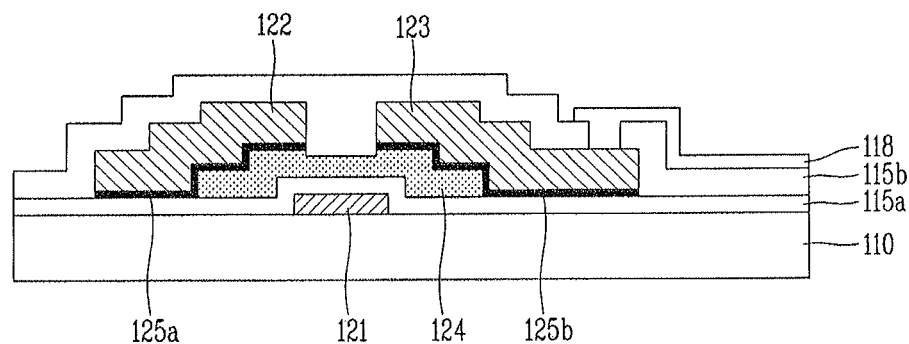

And then, as shown in FIG. 4E, a third conductive film is formed on the entire surface of the substrate 110 with the protective layer 115b formed thereon and then selectively removed through a photolithography process (a fifth masking process) to form the pixel electrode 118 formed of the third conducive film and electrically connected with the drain electrode 123 through the contact hole 140.

In this case, the third conductive film may be made of a transparent conductive material such as indium-tin-oxide or indium-zinc-oxide having excellent transmissivity in order to form the pixel electrode 118.

Meanwhile, as the oxide TFT according to the first exemplary embodiment of the present invention, a back channel etch type TFT is taken as an example, but the present invention is not limited thereto. The present invention can be applicable to an etch stopper type TFT in which an etch stopper made of a certain insulating material is formed on a channel region of an active layer. In this case, the etch stopper serves to prevent a carrier density in the channel region from being changed due to a plasma treatment in post-processing. This will now be described in detail through a second exemplary embodiment of the present invention.

Figure 5:
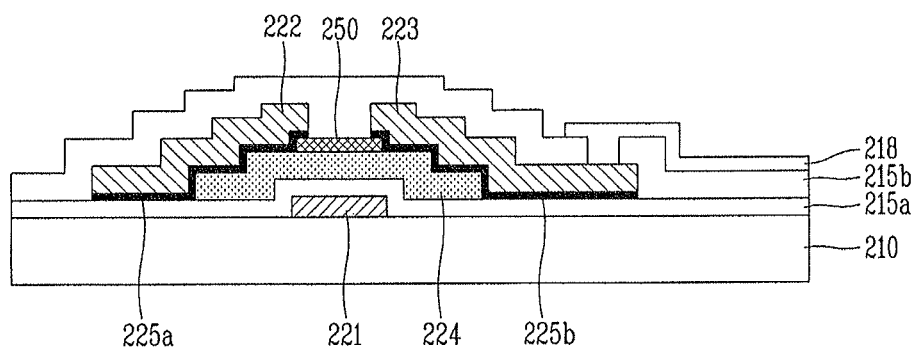
FIG. 5 is a sectional view schematically showing the structure of an oxide TFT according to a second exemplary embodiment of the present invention.

FIG. 5 is a sectional view schematically showing the structure of an oxide TFT according to a second exemplary embodiment of the present invention, in which an etch stopper type oxide TFT is schematically shown.

The oxide TFT according to the second exemplary embodiment of the present invention has the substantially same configuration as that of the oxide TFT according to the first exemplary embodiment of the present invention as described above, except that an etch stopper is formed on the active layer.

As illustrated in FIG. 5, the oxide TFT according to the second exemplary embodiment of the present invention includes a gate electrode 221 formed on a certain substrate 210, a gate insulating layer 215a formed on the gate electrode 221, an active layer 224 made of oxide semiconductor and formed on the gate insulating layer 215a, an etch stopper 250 made of a certain insulating material on a channel region of the active layer 224 and contact layers 225a and 225b formed on source and drain regions of the active layer 224, and source and drain electrodes 222 and 223 electrically connected with the source and drain regions of the active layer 224 through the contact layers 225a and 225b.

The oxide TFT according to the second exemplary embodiment of the present invention includes a protective layer 215b formed on the substrate 210 with the source and drain electrodes 222 and 223 formed thereon and a pixel electrode 218 electrically connected with the drain electrode 223 through a contact hole formed in the protective layer 215b.

Although not shown, the gate electrode 221 is connected to a certain gate line, and a portion of the source electrode 222 extends in one direction so as to be connected to a data line. The gate line and the data line are arranged vertically and horizontally on the substrate 210 to define a pixel area.

Here, in the oxide TFT according to the second exemplary embodiment of the present invention, for example, the active layer is formed by using amorphous zinc oxide (ZnO) semiconductor to satisfy high mobility and constant current test conditions and secure uniform characteristics, having advantages of being applicable to a large-scale display.

In particular, like the oxide TFT according to the first exemplary embodiment of the present invention as described above, in the oxide TFT according to the second embodiment of the present invention, the active layer is formed by using a-IGZO semiconductor such as a-InGaZnO$_4$ obtained by containing heavy metals such as indium (In), gallium (Ga), or the like, in ZnO.

In the oxide TFT having such characteristics according to the second exemplary embodiment of the present invention, the contact layer is formed by depositing a heterogeneous metal or oxide having conductive characteristics between the active layer and the source and drain electrodes to thus improve the contact characteristics between the active layer and the source and drain electrodes. Also, a threshold voltage and a turn-on voltage can be adjusted according to a work function between the source and drain electrodes, and since the etch stopper made of a certain insulating material is formed on the channel region of the active layer, the carrier density of the channel region can be prevented from being changed due to the plasma treatment in a follow-up process. This will now be described through a method for fabricating an oxide TFT as follows.

FIGS. 6A to 6E are sectional views sequentially showing a fabrication process of the oxide TFT illustrated in FIG. 5.

Figure 6A:
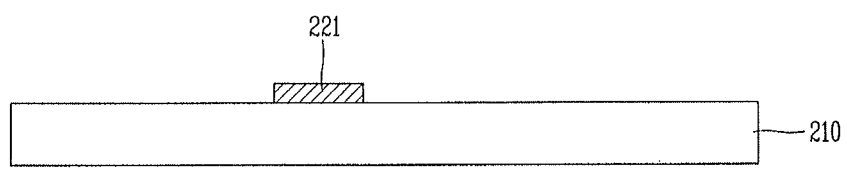
FIGS. 6A to 6E are sectional views sequentially showing a fabrication process of the oxide TFT illustrated in FIG. 5.

As shown in FIG. 6A, the gate electrode 221 is formed on the substrate 210 made of a transparent insulating material.

In this case, oxide semiconductor applied to the oxide TFT can be deposited at a low temperature, so the substrate 210, such as a plastic substrate, soda-line glass, or the like, which can be applicable to a low temperature process can be used. Also, since the oxide semiconductor exhibits amorphous characteristics, it can be used for the substrate 210 for a large-scale display device.

The gate electrode 221 is formed by depositing a first conductive film on the entire surface of the substrate 210 and selectively patterning the first conductive film through a photolithography process (a first masking process).

Figure 6B:
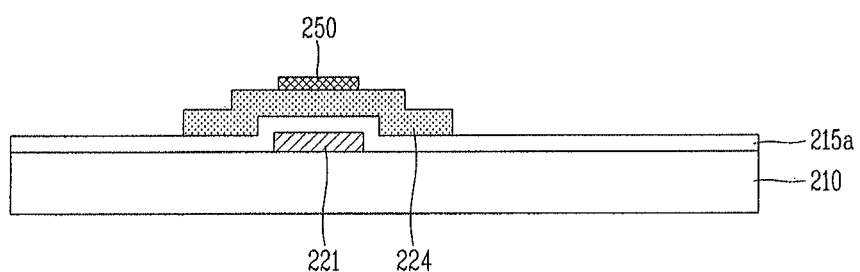

Next, as shown in FIG. 6B, the gate insulating layer 215a formed of an inorganic insulating layer such as a silicon nitride film (SiNx), a silicon oxide film (SiO$_2$), or the like, or a high dielectric oxide film such as hafnium (Hf) oxide, aluminum oxide, is formed on the entire surface of the substrate 210 with the gate electrode 221 formed thereon.

An oxide semiconductor layer made of certain oxide semiconductor and an insulating layer made of a certain insulating material are formed on the entire surface of the substrate 210 with the gate insulating layer 215a formed thereon and then patterned through a photolithography process (a second masking process) to form the active layer 224 and the etch stopper 250 made of the insulating material at an upper side of the gate electrode 221.

In this case, the second masking process may use a halftone mask.

In the oxide TFT according to the second exemplary embodiment of the present invention, since the active layer 224 is formed by using amorphous zinc oxide semiconductor, high mobility and constant current test conditions are met and uniform characteristics are secured, and thus, the oxide TFT can be applicable to a large-scale display.

Also, as mentioned above, the oxide TFT according to the first exemplary embodiment of the present invention, the active layer 124 is formed with a-IGZO semiconductor obtained by containing heavy metals such as indium, gallium, or the like, in ZnO.

Figure 6C:
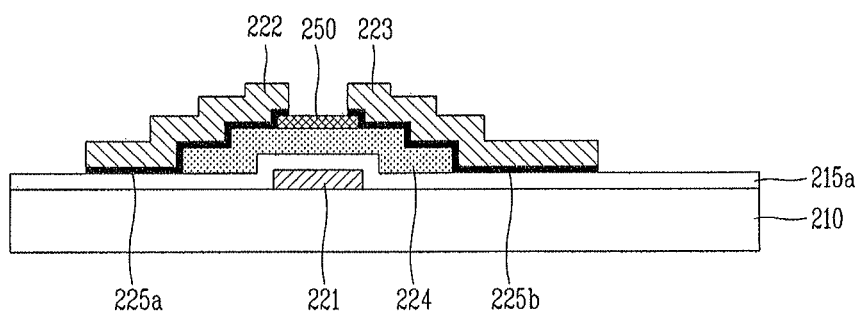

And then, as shown in FIG. 6C, a certain interlayer and a second conductive film are formed on the entire surface of the substrate 210 with the etch stopper 250 formed thereon by using sputter equipment.

In this case, the second conductive film may be made of copper, molybdenum, a molybdenum alloy such as molybdenum tungsten, or the like, in order to form the source and drain electrodes, and the interlayer may be made of a heterogeneous metal, oxide having conductivity, or the like, in order to adjust the contact characteristics between the active layer 124 and the source and drain electrodes.

For example, the interlayer may be made of a heterogeneous metal such as aluminum, gold, molybdenum, copper, titanium, nickel, or the like, or a heterogeneous alloy such as aluminum neodymium (AlNd), molybdenum titanium (MoTi), molybdenum tungsten (MoW), or the like. Also, the interlayer may be made of conductive oxide such as indium-gallium-zinc-oxide (IGZO), zinc-tin-oxide (ZTO), indium-tin-oxide (ITO), zinc-indium-oxide (ZIO), or the like.

In this case, the second conductive film may be formed to have a thickness ranging from 1000 Å to 3000 Å, and the interlayer may be formed to have a thickness ranging from 50 Å to 1000 Å.

Thereafter, the interlayer and the second conductive film are selectively patterned through a photolithography process (a third masking process) to form the contact layers 225a and 225b on the source and drain regions of the active layer 224 and the source and drain electrodes 222 and 223 electrically connected with the source and drain regions of the active layer 224 via the contact layers 225a and 225b.

In this case, the contact layers 225a and 225b and the source and drain electrodes 222 and 223 may be formed through the same masking process or different masking processes.

Figure 6D:
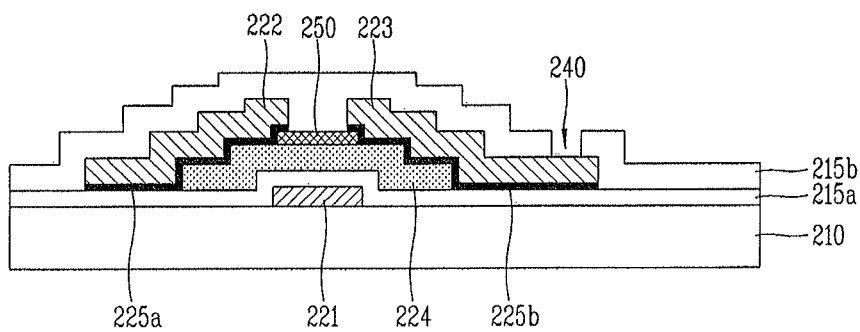

Thereafter, as shown in FIG. 6D, the protective layer 215b is formed on the entire surface of the substrate 210 with the source and drain electrodes 222 and 223 formed thereon and then selectively removed through a photolithography process (a fourth masking process) to form a contact hole 240, exposing a portion of the drain electrode 223, on the substrate 210.

Figure 6E:
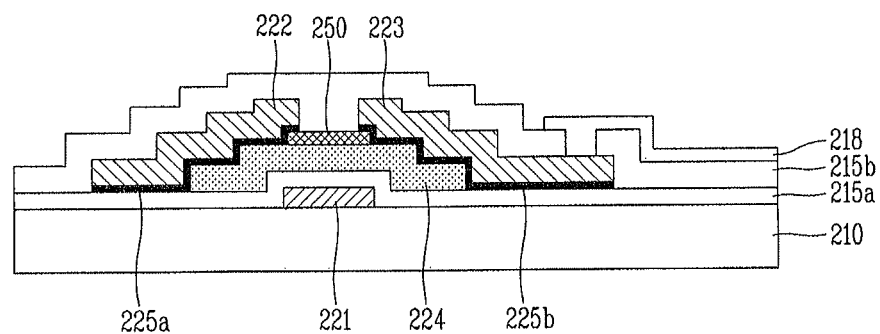

And then, as shown in FIG. 6E, a third conductive film is formed on the entire surface of the substrate 210 with the protective layer 215b formed thereon and then selectively removed through a photolithography process (a fifth masking process) to form the pixel electrode 218 formed of the third conducive film and electrically connected with the drain electrode 223 through the contact hole 240.

Figure 7:
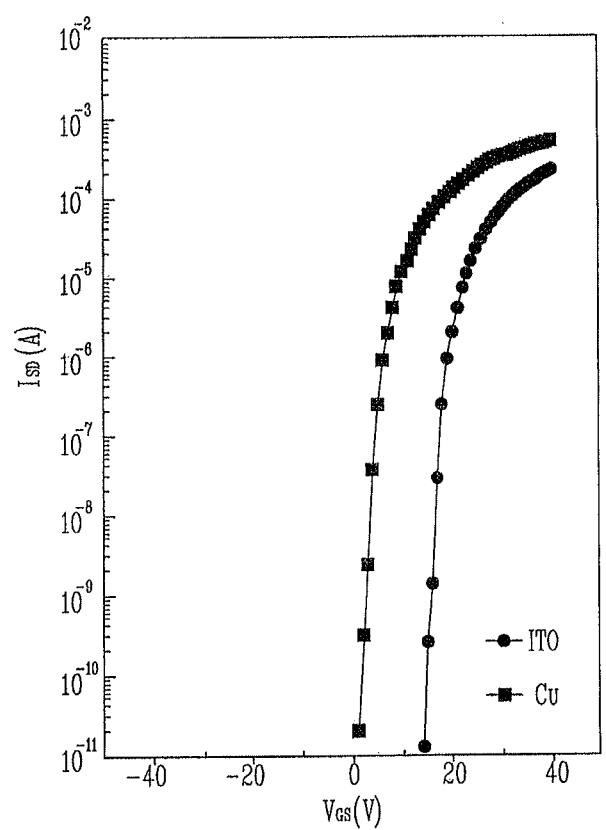
FIG. 7 is a graph showing an example of a transfer curved line of an oxide TFT according to an exemplary embodiment of the present invention.

FIG. 7 is a graph showing an example of a transfer curved line of an oxide TFT according to an exemplary embodiment of the present invention, in case of using molybdenum as a material of the source and drain electrodes and ITO and copper as materials of the contact layer.

Specifically, FIG. 7 shows a transfer curved line of an oxide TFT in which the voltage between source and drain electrodes is 10V and a channel has a width of 24 μm and a length of 12 μm.

As illustrated in FIG. 7, there is a difference in a threshold voltage according to the difference in a work function in case of using ITO and copper as materials of the contact layer, thus adjusting the turn-on voltage.

Namely, it is noted that when the contact layer is made of ITO, the threshold voltage is transferred to a positive voltage area, and when the contact layer is made of copper, the threshold voltage is close to 0. In this case, a driver integrated circuit (IC) may be installed within a panel to lower a production unit cost of the panel.

As described above, the present invention can be used for any other display devices fabricated by using a TFT, e.g., an organic electroluminescence display device in which an organic electroluminescence element is connected to a driving transistor, as well as for the LCD device.

In addition, since the amorphous zinc oxide semiconductor material which has high mobility and can be processed at a low temperature is used to form the active layer of the oxide TFT, the oxide TFT can be employed in a transparent electronic circuit or a flexible display.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

The invention claimed is:

1. A method for fabricating an oxide thin film transistor (TFT), the method comprising:
    forming a gate electrode made of a first conductive film on a substrate;
    forming a gate insulating layer on the substrate with the gate electrode formed thereon;
    forming an active layer made of oxide semiconductor on the gate insulating layer;
    forming an interlayer and a second conductive film on the substrate with the active layer formed thereon, wherein the interlayer is made of a different material from that of the second conductive film, to adjust a threshold voltage according to the difference in a work function;
    forming a contact layer on the substrate with the active layer formed thereon and forming source and drain electrodes, which are electrically connected with source and drain regions of the active layer through the contact layer, on the contact layer by selectively etching the interlayer and the second conductive film,
    wherein a back channel region of the active layer is partially etched simultaneously with the interlayer;
    forming a protective layer on the substrate with the source and drain electrodes formed thereon;
    forming a contact hole by removing the protective layer to expose the drain electrode; and
    forming a pixel electrode electrically connected with the drain electrode through the contact hole.

2. The method of claim 1, wherein the active layer is made of amorphous zinc oxide semiconductor.

3. The method of claim 1, wherein the contact layer is formed through a sputter.

4. The method of claim 1, further comprising:
    forming an etch stopper made of an insulating material on the substrate with the active layer formed thereon.

5. The method of claim 1, wherein the source and drain electrodes are made of copper, molybdenum, or a molybdenum alloy having low resistance.

6. The method of claim 1, wherein the contact layer is made of metal selected from the group consisting of aluminum, gold, molybdenum, copper, titanium, or nickel, and different from that used as a material of the source and drain electrodes.

7. The method of claim 1, wherein the contact layer is made of oxide having conductivity, selected from the group consisting of indium-gallium-zinc-oxide, zinc-tin-oxide, indium-tin-oxide, or zinc-indium-oxide.

8. The method of claim 1, wherein the contact layer is made of one of a conductive polymer or a doped organic material.

* * * * *